United States Patent [19]

Hagiwara

[11] 4,179,793
[45] Dec. 25, 1979

[54] METHOD OF MAKING A CHARGE TRANSFER DEVICE

[75] Inventor: Yoshiaki Hagiwara, Yokohama, Japan

[73] Assignee: Sony Corporation, Tokyo, Japan

[21] Appl. No.: 841,551

[22] Filed: Oct. 12, 1977

[30] Foreign Application Priority Data

Oct. 14, 1976 [JP] Japan .................................. 51-123189

[51] Int. Cl.$^2$ ............................................. B01J 17/00
[52] U.S. Cl. ........................................ 29/578; 29/589; 357/24
[58] Field of Search ..................... 29/571, 578, 589; 357/24, 91

[56] References Cited

U.S. PATENT DOCUMENTS

| 3,873,371 | 3/1975 | Wolf | 357/91 |
| 4,019,247 | 4/1977 | Borel | 357/91 |
| 4,035,906 | 7/1977 | Tasch | 357/91 |

Primary Examiner—W. C. Tupman
Attorney, Agent, or Firm—Hill, Van Santen, Steadman, Chiara & Simpson

[57] ABSTRACT

A method of making a charge transfer device which has charge transfer portions arranged in a semiconductor substrate, each of said charge transfer portions having electrodes, and in which an effective asymmetrical potential is produced in each of the charge transfer portions in a carrier transfer direction by the affect of the potential of channel stopper regions upon charge transfer. The method has the steps of forming channel stopper regions, which define a charge transfer line, in the substrate, forming a first polycrystalline semiconductor layer which becomes a first gate electrode of every second charge transfer portion, forming a second polycrystalline semiconductor layer which becomes a second gate electrode of the other of every second charge transfer portion, and forming a portion which is extended from at least the channel stopper region and produces the asymmetrical potential, by selectively doping an impurity into the substrate with the first and second polycrystalline semiconductor layers as a doping mask.

10 Claims, 27 Drawing Figures

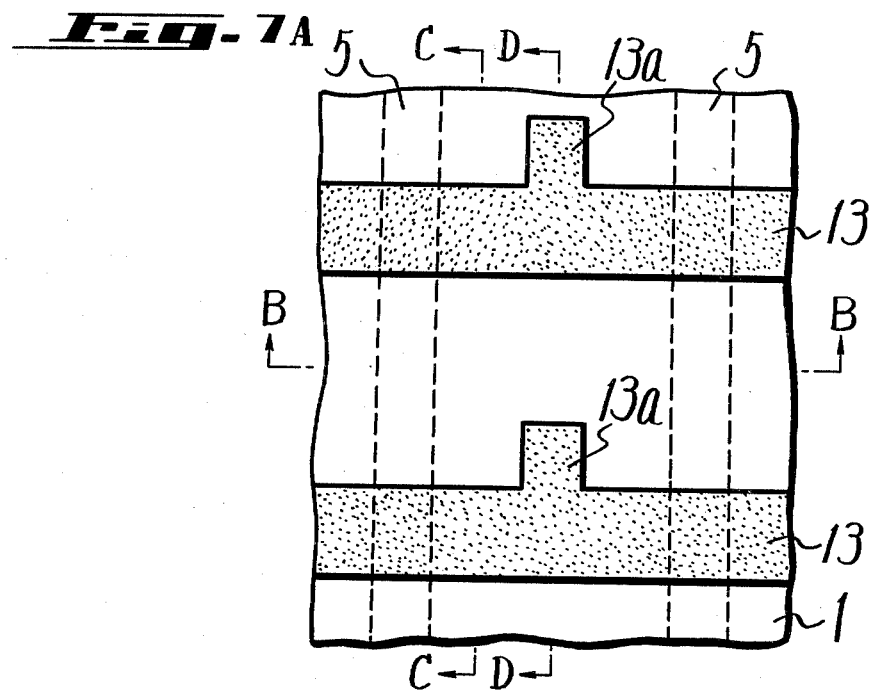
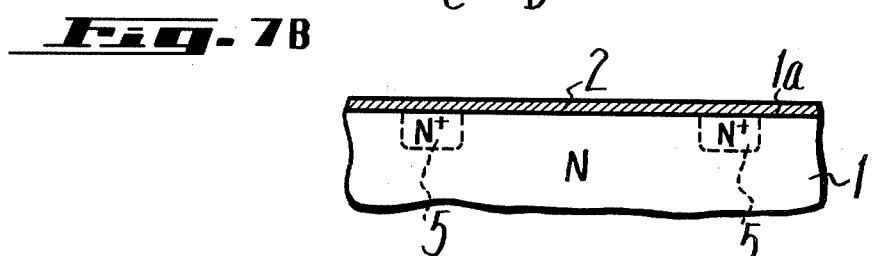
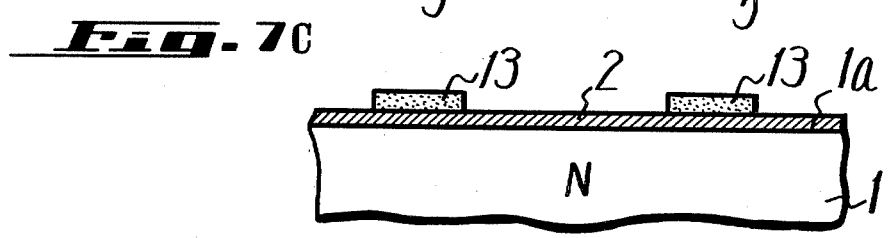
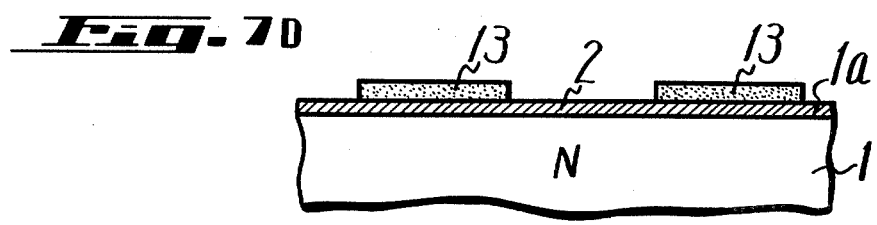

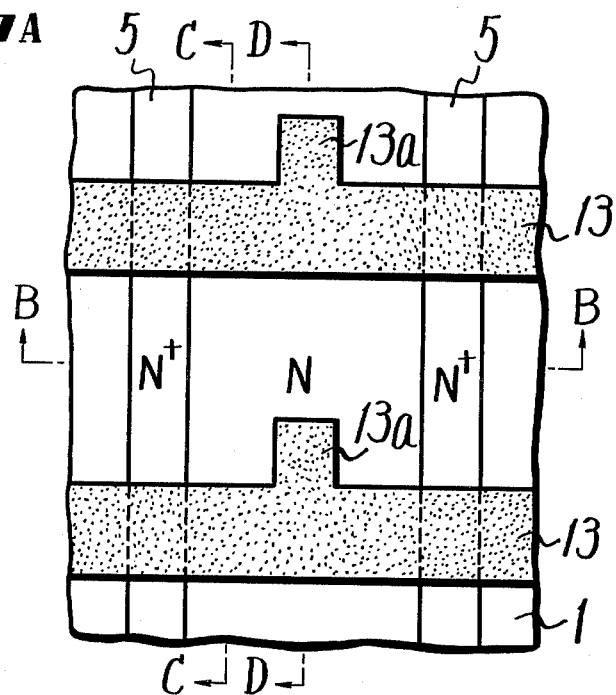
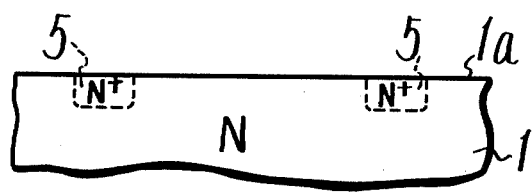
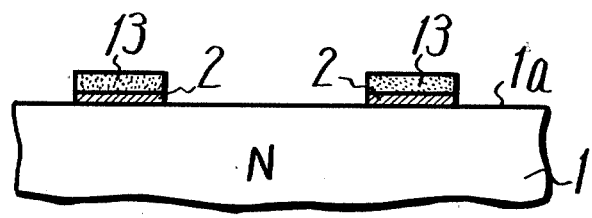
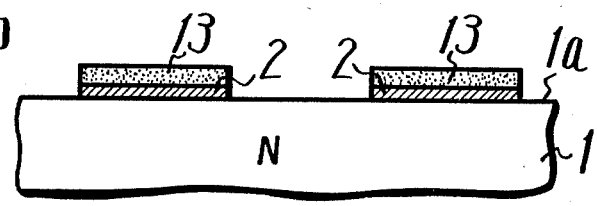

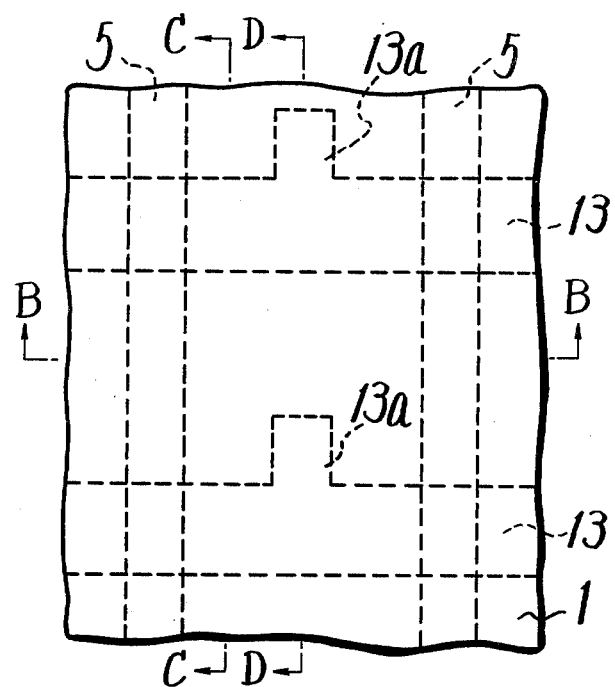
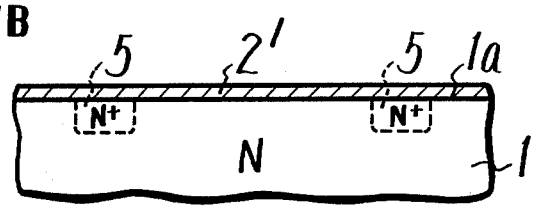
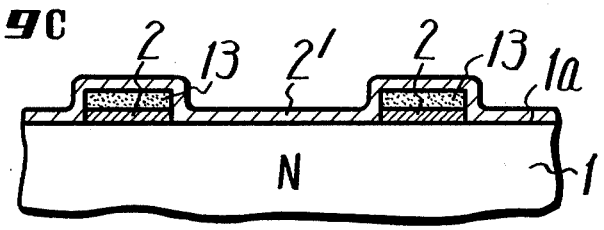
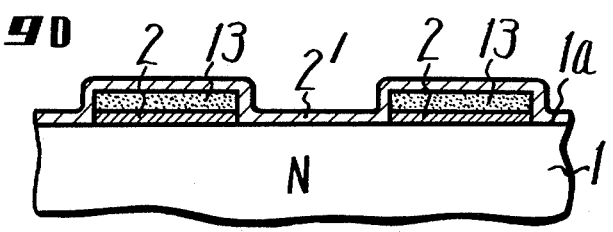

METHOD OF MAKING A CHARGE TRANSFER DEVICE

CROSS REFERENCE TO RELATED APPLICATIONS

My application, Ser. No. 821,183, filed Aug. 2, 1977, and assigned to the same assignee, discloses a method of making a charge transfer device of the type having a plurality of electrodes formed on an insulating layer and a transfer channel formed of a portion of the semiconductor substrate having a first impurity concentration, the transfer channel having narrow portions bordered by highly doped portions of the semiconductor substrate.

Application Ser. No. 703,792, of which I am a coinventor, filed July 9, 1976, and assigned to the same assignee as the present invention, discloses the physical structure of a charge transfer device of the type which can be made by the novel method of the present invention.

BACKGROUND OF THE INVENTION

The present invention relates generally to a method of making a charge transfer device, and is directed more particularly to a method of making a charge transfer device which is easy to be carried out so as to produce a novel charge transfer device with electrodes positioned accurately.

There are believed to be three ways to make an asymmetrical potential well for charge transfer devices employing a twophase clock circuit. More specifically, these three ways are as follows:

1. Change the thickness of the insulating layer;
2. Change the impurity concentration to form potential cells; and
3. Making projecting portions in the charge transfer array such as is shown in application, Ser. No. 703,792.

The present application describes a novel method of making a charge transfer device of the type listed above as No. 3.

OBJECTS AND SUMMARY OF THE INVENTION

It is an object of the invention to provide a method of making a charge transfer device.

Another object of the invention is to provide a method of making a novel charge transfer device which has charge transfer portions arranged in a semiconductor substrate, each of the charge transfer portions having gate electrodes, and in which an effective asymmetrical potential is produced in each of the charge transfer portions in a carrier transfer direction by the affect of the potential of the channel stopper regions upon charge transfer.

A further object of the invention is to provide a method of making a charge transfer device by which respective parts of the charge transfer device can be positioned accurately.

According to an aspect of the present invention, there is proposed a method of making a charge transfer device in which charge transfer portions, each having gate electrodes, are arranged in a semiconductor substrate, and an effective asymmetrical potential is produced in a carrier transfer direction in each of said charge transfer portion by the affect of the potential of the channel stopper regions upon carrier transfer, said method comprising the steps of forming channel stopper regions in a semiconductor substrate to define charge transfer lines, forming a first polycrystalline semiconductor layer which becomes a gate electrode of every second charge transfer portion, forming a second polycrystalline semiconductor layer which becomes a gate electrode of the other of every second charge transfer portion, and forming a portion, which is extended from at least said channel stopper region and produces said asymmetrical potential, by selectively doping an impurity into said semiconductor substrate with said first and second polycrystalline layers as a doping mask.

The other objects, features and advantages of the present invention will become apparent from the following description taken in conjunction with the accompanying drawings.

BRIEF DESCRIPTION OF THE DRAWINGS

FIGS. 7A to 11D are views illustrating a preferred embodiment of the method of making a charge transfer device according to the present invention.

DESCRIPTION OF THE PREFERRED EMBODIMENTS

In order to better understand the present invention, one prior art charge transfer device, which is of a twophase clock type, will be described, by way of example, with reference to FIGS. 1 and 2. In the figures, 1 designates a semiconductor substrate of one conductivity type, for example, an n-type silicon substrate. A first insulating layer 2A made of $SiO_2$ or the like is formed on a major surface of silicon substrate 1. Storage gate electrodes 3A, which are made of polycrystalline silicon layer of low resistivity to which, for example, an impurity is doped, are formed on the insulating layer 2A with a predetermined gap or distance d between adjacent electrodes 3A, and a second insulating layer 2B made of, for example, $SiO_2$ is formed on the first insulating layer 2A and storage electrodes 3A. Further, transfer gate electrodes 3B such as metal electrodes are formed on the second insulating layer 2B between the adjacent storage gate electrodes 3A. Each gate electrode 3A and one adjacent electrode 3B are electrically connected to form gate electrodes 3 which will form respective charge transfer portions. These gate electrodes 3 are alternately connected to every other gate electrode to form two sets of electrodes to which two-phase clock voltages $\phi_1$ and $\phi_2$ are applied, respectively.

With the above prior art charge transfer device, only the first insulating layer 2A exists under the storage gate electrodes 3A but the first and second insulating layers 2A and 2B exist under the transfer gate electrodes 3B. Therefore, the thickness of the substantial insulating layer under the gate electrodes 3A and 3B are different from each other with the result that even if the same voltage is applied to the electrodes 3, the surface potentials under the gate electrodes 3A and 3B become different and hence an asymmetrical potential well is established in the substrate 1 under the electrodes with respect to the charge transfer direction.

According to the charge transfer device constructed as above, asymmetrical potentials are produced in the respective charge transfer portions where the gate electrodes 3, each having the storage and transfer gate electrodes 3A and 3B, are provided so that, by applying two-phase clock voltages to two sets of every other gate electrode, there is produced a step potential between adjacent charge transfer portions which becomes lower in one direction. As a result, charge or carriers can be transferred in one direction, for example, as indicated by arrows 4 in FIG. 1.

Figure 1:
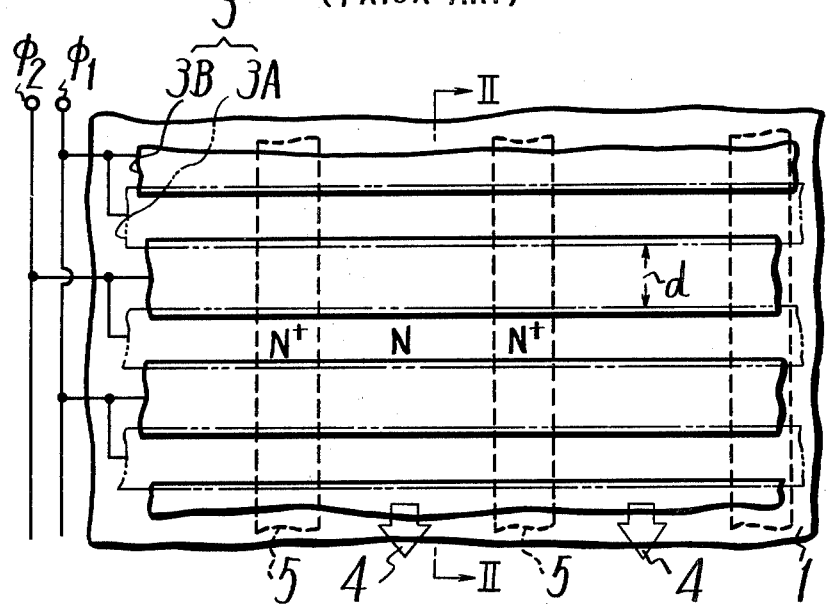
FIG. 1 is a plan view showing, in an enlarged scale, a main part of a prior art charge transfer device.
Figure 3:
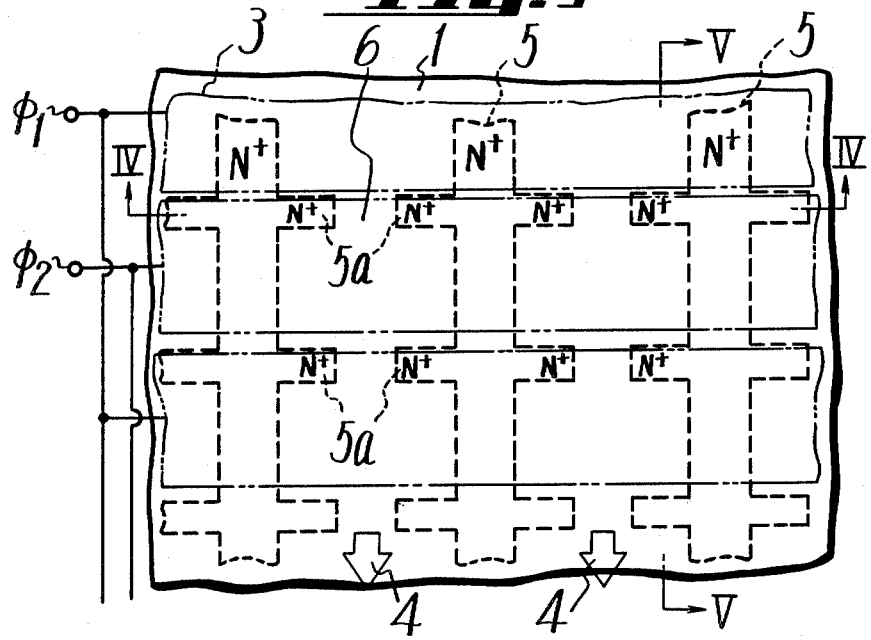
FIG. 3 is a plan view showing, in an enlarged scale, a main part of a charge transfer device which is made in accordance with the teachings of the present invention.
Figure 2:
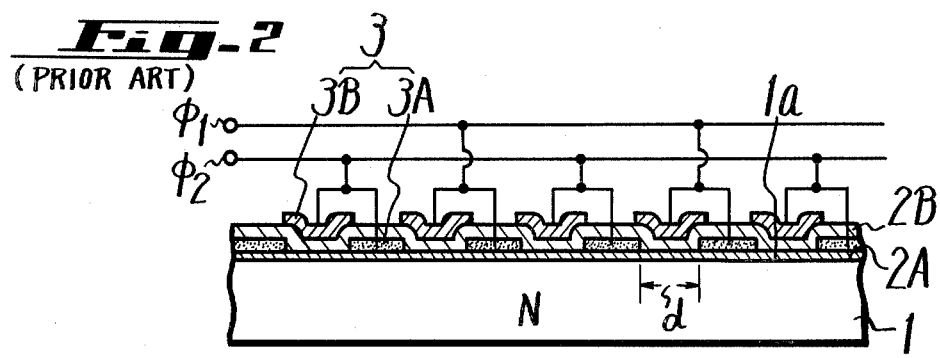
FIG. 2 is a cross-sectional view taken on the line II—II in FIG. 1.
Figure 4:
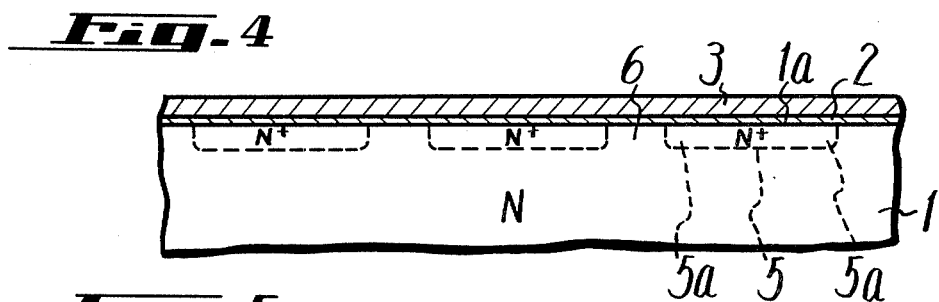
FIGS. 4 and 5 are cross-sectional views on the lines IV—IV and V—V in FIG. 3.
Figure 5:
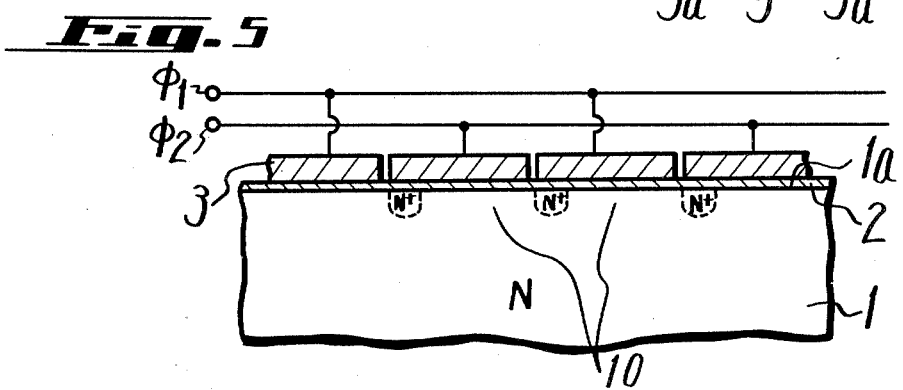

In FIG. 1, 5 designates channel stopper regions between the respective transfer lines, for example, between vertical shift registers. These channel stopper regions are formed by selectively diffusing an impurity into the surface of substrate 1 and have the same conductivity as that of substrate 1 but higher impurity concentration than that of substrate 1 so as to restrict the transfer line.

As described above, the charge transfer device shown in FIGS. 1 and 2 can achieve its charge transfer by the two-phase clock voltages but note that it has the disadvantage that it is rather complicated since, in order to produce asymmetrical potentials in the respective charge transfer portions, the storage and transfer gate electrodes, which form a gate electrode set, are provided through insulating layers of different thicknesses on the substrate.

In order to avoid the above defect, the U.S. patent application, Ser. No. 703,792 was filed on July 19, 1976, which is assigned to the same assignee as this application. This U.S. Patent application discloses a charge transfer device in which an asymmetrical potential is produced by utilizing a potential produced by the channel stopper regions.

An example of the charge transfer device, in which the asymmetrical potential is produced by the potential of the channel stopper regions, will be now described with reference to FIGS. 3 to 6. In this example, channel stopper regions 5, which define, for example, vertical shift lines and each of which has a band shape, are formed in, for example, an N type semiconductor substrate 1 made of silicon in parallel with one another in the vertical direction. In this case, each of the channel stopper regions faces a major surface 1a of the semiconductor substrate 1. On the major surface 1a of the semiconductor substrate 1, there is formed an insulating layer 2 made of $SiO_2$ or the like, and gate electrodes 3, each having a band shape, are formed on the insulating layer 2 across the respective vertical lines separated by the channel stopper regions 5 and common to the respective horizontal lines. In this case, from each of the channel stopper regions 5 there is extended portions 5a in the direction to the side vertical lines. The extended portions 5a are formed in charge transfer portions 10 formed under the electrodes 3 at the rear portion with respect to the charge transfer direction indicated by arrows 4 in FIG. 3, so that narrow portions 6 are formed in the charge transfer paths by the extended portions 5a for the potential in the charge transfer portions to be affected by the potentials of the channel stopper regions 5. In this example, similar to the previous example, every other electrode is electrically connected to form two sets of electrodes which are supplied with two-phase clock voltages $\phi_1$ and $\phi_2$, respectively.

Figure 6:
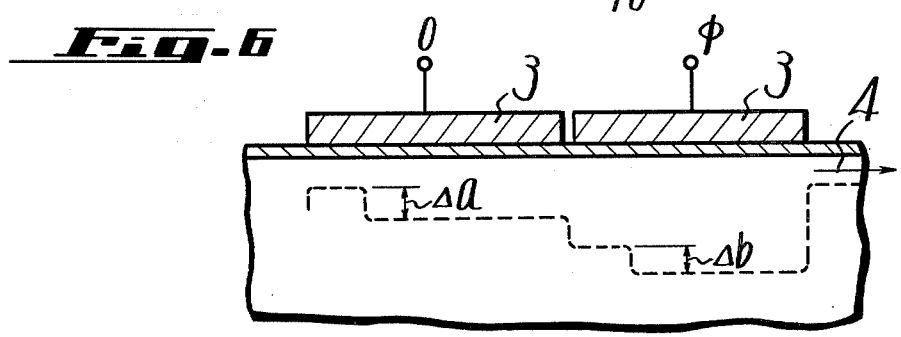
FIG. 6 is a cross-sectional view illustrating the operation of the charge transfer device shown in FIGS. 3 to 5.
Figure 10A:
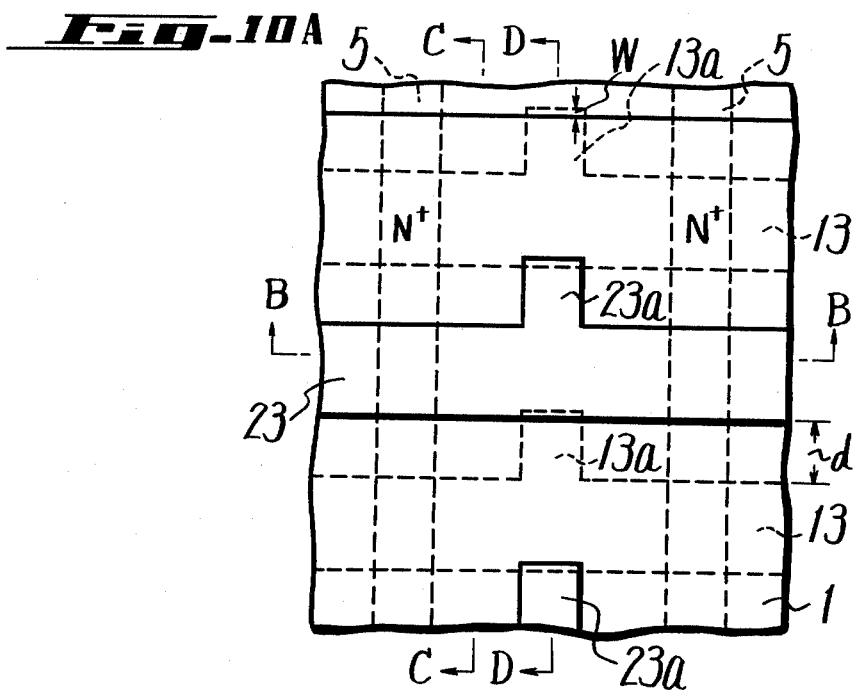
Figure 10B:
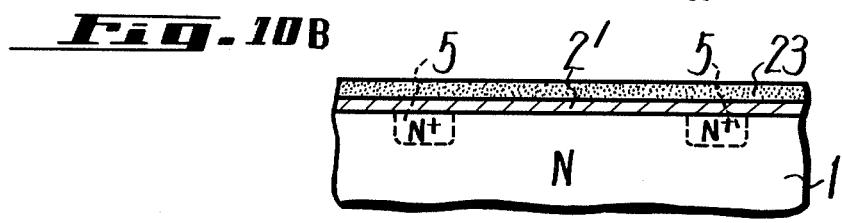
Figure 10C:
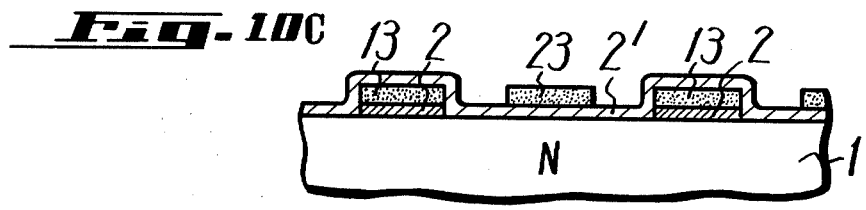
Figure 10D:
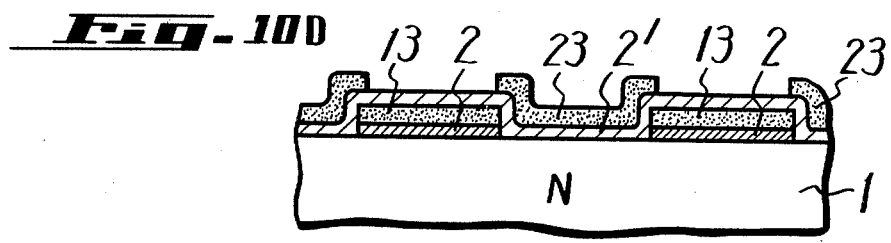
Figure 11A:
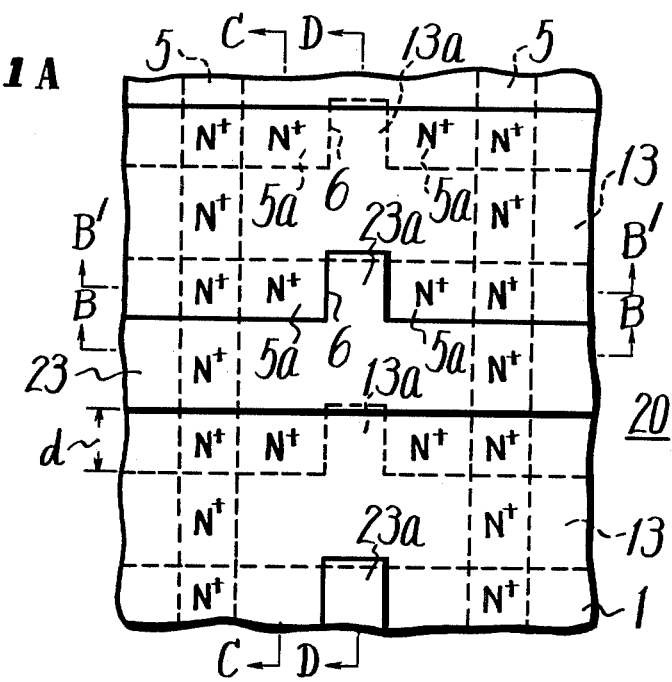
Figure 11B:
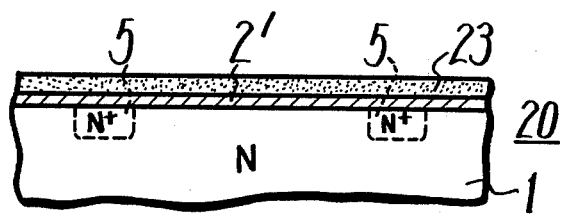
Figure 11B:
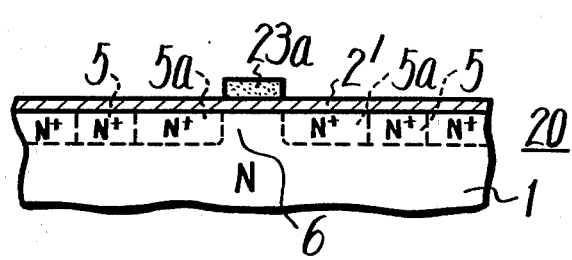
Figure 11C:
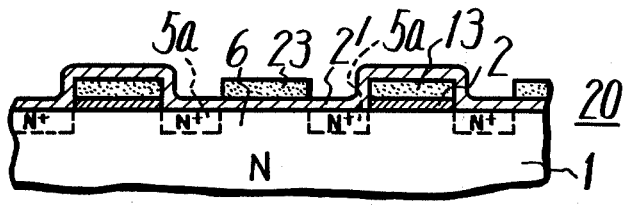
Figure 11D:
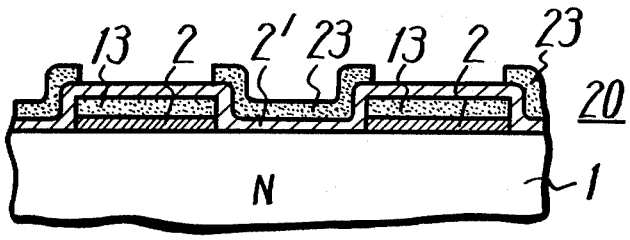

With the charge transfer device described just above, since in each of the transfer portions 10 a surface potential at the narrow portions is different from that at the other portion, the potential is asymmetric with respect to the charge transfer direction. That is, as shown in FIG. 6, when a negative clock voltage $\phi$ of, for example, $-10$ V is applied to one of the adjacent electrodes 3, such a potential distribution is produced as indicated by a dotted line in FIG. 6 in the charge transfer direction. As indicated by the dotted lines in FIG. 6, potential barriers which are higher than the other potentials by $\Delta a$ and $\Delta b$ are formed in the potentials produced in the narrow portions 6 of transfer portions 10 under the electrodes 3 by the affect of extended portions 5a of channel stopper regions 5, and hence the potential becomes a stepped one from the portion under the electrode 3 supplied with 0 V to the portion under the electrode 3 supplied with $-10$ V with the result that the charges or carriers are transferred in the direction indicated by an arrow 4 in FIG. 6.

The charge transfer device, which utilizes the potential by the channel stopper region 5, produces the asymmetrical potential without employing a method, for example, to change the thickness of the insulating layer between the substrate and electrode as described above, so that the charge therein can be transferred by the two-phase clock voltage. In this case, it is highly desired that the positional relation between the portion affected by the channel stopper region 5 at the rear side of the channel transfer portion or narrow portion 6 and the electrode 3, that is, the positional relation amount the rear edge of narrow portion 6 or line connecting the rear edges of the opposing extended portions 5a, the rear edge of electrode 3 formed above the narrow portion 6 and the front edge of the other electrode 3 adjacent the rear edge of the former electrode 3 are formed coincident as accurately as possible.

The method of the invention is to easily make the charge transfer device described just above in connection with FIGS. 3 to 6 which requires the accurate positional relation.

An example of the method of making a charge transfer device according to the present invention will be described with reference to FIGS. 7 to 11, in which FIGS. 7A, 8A, 9A, 10A and 11A are enlarged plan views of main parts in the respective making process; FIGS. 7B, 7C, 7D, 8B, 8C, 8D—11B, 11C and 11D are cross-sectional views on lines B-B, C-C and D-D in FIGS. 7A, 8A,—11A, and FIG. 11B' is a cross-sectional view on line B'—B' in FIG. 11A, respectively.

First, as shown in FIGS. 7A to 7D, a semiconductor substrate of one conductivity type, for example N type semiconductor substrate 1 is prepared. Channel stopper regions 5 of a band shape are formed in the substrate 1 parallel to one another and with a predetermined distance between adjacent ones to face a major surface 1a of substrate 1 so as to restrict charge shift lines, for example, vertical lines. These channel stopper regions 5 can be formed by a well-known method, for example, by a selective diffusion method. Thereafter, $SiO_2$ is coated on the major surface 1a by a well-known method, for example, thermal oxidizing or the like up to a predetermined thickness to form an insulating layer 2. On the insulating layer 2 are formed first gate electrodes 13, which will become every other gate electrode of charge transfer portions, common to or across the respective vertical lines and intersecting at the extending direction of channel stopper regions 5 (horizontal direction). Each of the first electrodes 13 is formed of a band shape but has a projection 13a which is extended from one side of band-shaped electrode 13 at about the center of the vertical line defined by the channel stopper regions 5 in the vertical direction. The method of forming the first electrode 13 having the projection 13a is that a semiconductor layer, for example, polycrystalline silicon layer of a low resistivity due to impurity doping thereto is coated on the whole surface of insulating layer 2 by a chemical vapor deposition method, and then unnecessary portions thereof are removed by a photo-etching method to form a desired pattern.

Secondly, as shown in FIGS. 8A to 8D, the insulating layer 2 is selectively etched out with the first electrodes 13 as a mask from the major surface 1a of substrate 1.

Then, as shown in FIGS. 9A to 9D, insulating material such as $SiO_2$ is coated on the surface of first electrodes 13 and the major surface 1a from which the insulating layer 2 is removed up to a predetermined thickness by a surface-thermal oxidization to form a second insulating layer 2'. This second insulating layer 2' is selected to be the same as the first insulating layer 2 in material and thickness.

Next, as shown in FIGS. 10A to 10D, second gate electrodes 23, which will become the gate electrodes for every other charge transfer portion different from the previously-mentioned every other charge transfer portion, are selectively formed on the second insulating layer 2' between the adjacent first electrodes 13. The second gate electrodes 23 are formed by a similar method to that used to form the first gate electrodes 13. In this case, a projected portion 23a is formed from one side of each of the second gate electrodes 23 at its center such that the projection 23a projects on the line the same as the projecting line of projection 13a of the first gate electrode 13. The second gate electrode 23 can be also formed such that it partially overlaps on the tip end edge of projection 13a of the first electrode 13 with a width W smaller, for example, than 1 μm, but it is spaced at its other portion from the electrode 13 by a predetermined distance d.

Then, as shown in FIGS. 11A to 11D, an impurity having the same conductivity type as that of substrate 1 is implanted from the major surface 1a of substrate 1 thereinto at the portions where no first and second gate electrodes 13 and 23 exist, with the latter as a mask of the impurity doping, at a predetermined implantation energy. Thus, regions of high impurity concentration or extended regions 5a of channel stopper regions 5 are formed in the parts between both electrodes 13 and 23 with the distance d. In this case, the thickness of insulating layers 2 and 2' is selected, for example, 1300 Å and that of the polycrystalline layers is selected for example, 5000 Å, so that it is possible to selectively form the regions 5a only at the portions where no electrodes 13 and 23 exist by suitably selecting the energy of impurity implantation. A charge transfer device 20, which has narrow portions 6 between opposing extended regions 5a of channel stopper regions 5 similar to those 6 described in connection with FIGS. 3 to 6, are formed.

With the above charge transfer device 20 made by the method of this invention, if two-phase clock pulses $\phi_1$ and $\phi_2$ are applied across the electrodes 13 and 23 similar to that described previously, a potential, which is asymmetric with respect to the charge transfer direction at the narrow portion 6 by the affect of the channel stopper region 5, is produced in the charge transfer portion formed under the respective gate electrodes 13 and 23. Thus, the charge transfer device 20 shown in FIG. 11 becomes of the two-phase clock type.

According to the method of the present invention described above, the extended portion 5a of channel stopper region 5 is selectively formed through the distance d between the electrodes 13 and 23 on every other charge transfer portion, so that the front and rear ends of both electrodes 13 and 23 and the narrow portion 6 can be formed accurately with a predetermined positional relation and it is avoided by the insulating layer 2' that both the electrodes 13 and 23 are short-circuited.

With the example of the invention described above, during the step shown in FIG. 8, the parts of the insulating layer 2 where the second gate electrodes 23 are formed, are selectively removed and then the insulating layer 2' is formed thereon, but it is possible that without removing the insulating layer 2 the insulating layer 2' of relatively thin thicknesses of the insulating layers under every other electrodes 13 and 23 are different from each other. However, the charge transfer can be carried out without any trouble by suitably selecting the clock voltage.

Further, with the above example of the invention, during the impurity doping process to form the extended portion 5a of channel stopper 5, the fact that the parts on which the first and second gate electrodes 13 and 23 are formed are thicker than that of the other part is utilized to implant the impurity through the distance d between the gate electrodes 13 and 23 to the substrate 1 by suitably selecting the ion implantation energy. However, it is possible in some cases that before the process shown in FIG. 11, the parts of insulating layer 2' between the first and second electrodes 13 and 23 are removed by etching with the electrodes 13 and 23 as an etching mask, then through the portion from which the insulating layer 2' is removed an impurity is implanted into the substrate 1 by the selective diffusion method or ion implantation method at high impurity concentration and then the selective diffusion method is employed to form the extended region 5a of channel stopper region 5.

In the charge transfer device made by the above example of the invention, the channel stopper region 5 and its extended region 5a in the substrate 1 are of the N type, but it will be apparent that the present invention is adapted to make a charge transfer device which is different from the above charge transfer device in the conductivity type with the same effect.

Further, the example of the invention is adapted to make a surface channel charge transfer device, but the present invention can be adapted to make a buried channel charge transfer device with the same effect.

It will be apparent that many modifications and variations could be effected by one skilled in the art without departing from the spirit or scope of the novel concepts of the present invention.

I claim as my invention:

1. A method of making a charge transfer device in which charge transfer portions, each having gate electrodes, are arranged, and an effective asymmetrical potential is produced in a carrier transfer direction in each of said charge transfer portions by an affect of potential of a channel stopper region upon carrier transfer, said method comprising the steps of:

(a) forming channel stopper regions in a surface of a semiconductor substrate to define a charge transfer line therebetween;

(b) forming and shaping a first conductive layer electrically insulated from said substrate over said surface to provide a first set of gate electrodes;

(c) forming and shaping a second conductive layer electrically insulated from said first conductive layer to provide a second set of gate electrodes interleaves with said set but spaced therefrom adjacent said channel stopper regions; and (d) forming a portion, which narrows a width of said charge transfer line and produces said asymmetrical potential, by selectively doping an impurity through said spaces between said first and said second sets of electrodes and into said substrate adjacent said channel stopper regions while using said first and second sets of electrodes as diffusion masks.

2. A method of manufacturing a charge transfer device having a charge transfer channel formed of a portion of a semiconductor substrate transferring signal charges in one direction, said transfer channel having narrowed portions bordered by channel stopper regions formed of a portion of said semiconductor substrate comprising the steps of:

(a) forming a plurality of first conductive layers electrically insulated from said semiconductor substrate lying in the direction transverse to said one direction, each of said first conductive layers having a projection portion defined by a portion of said first conductive layer having a width larger than the width of remaining portion of said first conductive layer above said charge transfer channel, (b) forming a plurality of second conductive layers electrically insulated from said semiconductor substrate and said first conductive layers, lying in the direction parallel to said first conductive layer, having a projection portion defined by a portion of said second conductive layer having a width larger than the width of remaining portion of said second conductive layer above said charge transfer channel, said first and second conductive layers being interleaved with each other, and partially overlapping with each other at said projection portions of said conductive layers leaving uncovered portions above said transfer channel by said first and second conductive layers, (c) selectively doping an impurity through said uncovered portion into said semiconductor substrate to form said narrowed portions of said charge transfer channel.

3. The method of claim 2, wherein said channel stopper region is defined by a portion of said substrate having conductivity type different from said charge transfer channel.

4. The method of claim 2, wherein said projection portions are located above center of said transfer channel, to leave said uncovered portions at the both sides of said projection portions.

5. The method of claim 2, wherein said portion, which narrows the width of said charge transfer line is a portion extending from at least said channel stopper region.

6. The method of claim 2, wherein said first and second conductive layers are polycrystalline silicon layers.

7. The method of claim 2, wherein said doping is carried out by ion implantation.

8. The method of claim 2, wherein said channel stopper region is defined by a surface portion of said substrate having a higher impurity concentration than the remaining surface portion of said substrate.

9. A method of manufacturing a charge transfer device having a charge transfer channel formed of a portion of a semiconductor substrate transferring signal charges in one direction, said transfer channel having narrowed portions bordered by channel stopper regions formed of a portion of said semiconductor substrate comprising the steps of:

(a) forming a channel stopper region in said semiconductor substrate adjacent to a major surface of said semiconductor substrate to define a charge transfer channel therebetween, (b) forming an insulating layer on said major surface of said semiconductor substrate, (c) forming a plurality of first conductive layers on said insulating layer, lying in the direction transverse to said one direction, each of said first conductive layers having a projection portion defined by a portion of said first conductive layer having a width larger than the width of remaining portion of said first conductive layer above said charge transfer channel, (d) forming a plurality of second conductive layers electrically insulated from said semiconductor substrate and said first conductive layers, lying in the direction parallel to said first conductive layer, having a projection portion defined by a portion of said second conductive layer having a width larger than the width of remaining portion of said second conductive layer above said charge transfer channel, said first and second conductive layers being interleaved with each other, and partially overlapping with each other at said projection portion of said conductive layers leaving uncovered portions above said transfer channel by said first and second conductive layers, (e) selectively doping an impurity through said uncovered portion into said semiconductor substrate to form said narrowed portions of said charge transfer channel.

10. The method of claim 9, which further comprises the steps of partially removing said insulating layer which is not covered by said first conductive layer, and forming an insulating layer over all the surface.

* * * * *